United States Patent [19]

Richards, Jr.

[11] 4,120,569
[45] Oct. 17, 1978

[54] METHOD AND APPARATUS FOR THE HOLOGRAPHIC STORAGE AND RETRIEVAL

[75] Inventor: Chester L. Richards, Jr., Irvine, Calif.

[73] Assignee: Marvin H. Kleinberg, Beverly Hills, Calif. ; a part interest

[21] Appl. No.: 757,659

[22] Filed: Jan. 7, 1977

Related U.S. Application Data

[63] Continuation of Ser. No. 540,321, Jan. 13, 1975, abandoned.

[51] Int. Cl.² .......................... G03H 1/12; G02F 1/03
[52] U.S. Cl. .................... 350/3.68; 350/96.13; 350/96.14; 350/356; 350/360; 365/216
[58] Field of Search ............... G02B/5/14; 350/3.5, 350/96 WG, 160 R, 160 W, 161, 3.68, 96.14, 96.13, 353, 356, 359, 360; 340/173 LT, 173 LM; 365/216, 125

[56] References Cited

U.S. PATENT DOCUMENTS

| 3,484,147 | 12/1969 | Collier ................................. 350/3.5 |
| 3,626,511 | 12/1971 | Hammer ........................... 350/160 R |
| 3,954,323 | 5/1976 | Andrews et al. ............... 350/96 WG |

FOREIGN PATENT DOCUMENTS 1,171,443  11/1969  United Kingdom ..................... 350/3.5

OTHER PUBLICATIONS

LaMacchia et al., Applied Optics, vol. 7, No. 1, Jan. 1968, pp. 91-94.
Caulfield et al., Applied Optics, vol. 6, No. 7, Jul. 1967, p. 1272.
Hammer, Applied Physics Letters, vol. 18, Feb. 1971, pp. 147-149.

Primary Examiner—Ronald J. Stern

[57] ABSTRACT

A process and apparatus is disclosed for imposing selectable, sequential, spatial modulations upon a reference beam for the storage in a suitable medium of a hologram. Changing the spatial modulations enables the storage of several, different holograms in the same medium. Each hologram can be individually reconstructed by imposing upon the reconstructing illumination beam the same spatial modulations.

40 Claims, 22 Drawing Figures

METHOD AND APPARATUS FOR THE HOLOGRAPHIC STORAGE AND RETRIEVAL

This is a continuation of application Ser. No. 540,321, filed Jan. 13, 1975 now abandoned.

BACKGROUND OF THE INVENTION

1. Field of the Invention

This invention relates to memory devices and, more particularly, optical holographic memories and means by which such memories can be accessed.

2. Description of the Prior Art

Optical holography shows great promise as a technique for storing and retrieving information. This is partly because it makes efficient use of the large storage capacity of modern photosensitive recording materials. In addition, a hologram has a number of properties not possessed by a conventional photograph.

A hologram is relatively insensitive to damage. Fingerprints, scratches, dust or breaks do not obscure the image formed from a hologram as they would obscure parts of a photographic image. Thus, important information contained in the image is not lost by damage to the hologram.

It is also possible, by multiply exposing the hologram, to store, in the same piece of photosensitive material, images of several different objects, recorded at different times. These images can be retrieved, one at a time, with relatively little interference from the other images of the multiple exposure. The images of the different objects are said, therefore, to be multiplexed in the hologram. The same cannot be said for conventional photography.

Finally, by holographic techniques, full use can be made of the storage capacity of a photosensitive material regardless of the volumetric configuration of that material. Since a thick photomaterial is capable of storing far more data than a thin material, this capability would be of great advantage in a memory device.

Unfortunately, existing methods of implementing a holographic data bank are clumsy. To see why this is so, a brief description of the typical holographic apparatus is necessary.

An optical hologram is a record of the interference pattern produced when two wavefronts of light overlap. The wavefronts must be mutually coherent so that the interference pattern is stationary and will not be smeared during the recording process. Mutual coherence merely means that there is a fixed phase relationship between the spatially overlapping parts of the two wavefronts.

In normal practice, the two wavefronts are derived from a single, sufficiently coherent light source by means of a beam splitting device. A half silvered mirror in the beam of a laser is often suitable for the production of the two wavefronts.

One of the two wavefronts is scattered from some object, thenceforth carrying with it information about the visual appearance of the object. In the context of information storage, the object from which this wavefront is scattered is called a "page composer." The page composer impresses on the wavefront a stylized pattern which may be interpreted by some conventional readout device. The page pattern may be altered in accordance with the information being transmitted.

The information about the appearance of the object or page composer is located primarily in the spatial pattern of phase relationships contained in the scattered object (or signal carrying) wavefront. The hologram is capable of storing this phase pattern. This is possible because a second, or reference, wavefront, when superimposed on the object wavefront, acts as a phase reference standard. The two wavefronts interfere and the interference shows up as a pattern of light and dark. This interference pattern can be recorded by placing a piece of photosensitive material in the region of space where the two wavefronts overlap and interfere. This recording is the hologram.

During the reconstruction process, the true object wavefront is absent, either because the scattering object has been removed or because this wavefront has been blocked. The reference wave passes through the developed hologram as it did during the recording period, but now it is spatially modulated by the pattern recorded there. The hologram impresses again on the wavefront the interference pattern which once existed. When this pattern has been impressed, the wavefront is changed into a replica of the two wavefronts which originally produced the interference. Hence, the wavefront will propagate "downstream" of the hologram as if the original object wave, as well as the reference, were still present. The object wave is therefore said to have been reconstructed.

Traditionally, in order to maintain a constant intensity reference field across the hologram, the reference wave has been formed as a plane or spherical wave. Holographic data storage devices which use this type of reference wave necessarily must be clumsy in construction and, usually, slow in operation.

The reason is that plane or spherical waves are not really suited to serve as reference waves for a multiplexed hologram. If the photomaterial is in the form of a thin sheet, the images preserved in a multiply exposed hologram, referenced by plane waves, will have a tendency to overlap and conflict. To circumvent this problem, the holograms of separate objects are not multiplexed into the same region of the recorder. Rather, they are laid side by side on the sheet of photomaterial in the form of an album of nonoverlapping holograms. While this arrangement avoids the problem of conflict during the reconstriction, it does require that both the reference and object beams be deflected to different positions. This requirement means that the holographic apparatus takes up excessive space and requires one or more beam deflectors.

A light beam cannot be easily deflected from its path by electromagnetic means. Thus, optical beam deflectors usually are partly mechanical in nature. A motor rotated mirror or an acoustic Bragg diffraction cell are two examples of popular beam deflectors. These devices suffer from a number of undesirable characteristics, but lack a flexibility, lack of speed, large size and high power consumption are dominant.

If a thick photosensitive material is used to record the holograms, true multiplexing may be obtained even when plane waves are used as references. This is because the interference patterns in a thick hologram form Bragg diffraction surfaces which are spatially selective in nature. By somewhat changing the angle of incidence of the plane or spherical wave used to reference each of the multiplexed holograms, the holograms may be kept separate. Each hologram may be individually reconstructed by reintroducing the reference wave at precisely the same angle of incidence that was used when that hologram trace was formed. Unfortunately, this format for a holographic apparatus also requires optical beam deflectors for control of the reference wave.

The thick hologram is also color selective so that multiplexing may be accomplished by using a different wavelength of light for each exposure. This is not at present a practical technique since rapidly tunable light sources of sufficient coherence and brightness are not as yet available.

There is another type of wavefront, radially different from a simple plane or spherical wave, which may be used successfully as a reference wave. This is a wavefront which, at a distance far enough from the hologram region to be considered the far field, possesses a very complicated phase and amplitude pattern. This pattern must possess an autocorrelation function which is much narrower than any distinguishable part of the pattern of information impressed by the page composer on the object wavefront.

A random pattern is often capable of meeting these criteria. When these conditions are met, the reference wave will behave during the reconstruction as if it were of constant intensity over the region of space spanned by the hologram. A hologram which uses a complicated wavefront of this type as a reference wave is denoted a "ghost image," or sometimes a "source compensation," hologram.

SUMMARY OF THE INVENTION

The hologram used in the present invention is of this type. Specifically, what the present invention accomplishes is to provide means whereby a complicated pattern with a sufficiently narrow autocorrelation function may be impressed on or used to modulate the reference wavefront. Moreover, the impressed pattern may be controlled and changed by means of some external, predetermined signal. The result is that a large variety of patterns can be impressed on the reference wavefront, each of which is determined by a "controlling" signal. The device which accomplishes this particular feat is hereafter denoted a "reference selector."

What is especially unique and valuable about this invention is that each of the selected patterns produced by the reference selector can be designed in such a way as to be uncorrelated with all of the other patterns. This means that the system may be used to multiply record holograms of different "objects" or "pages" in such a way that individual pages may be retrieved without significant conflict from other multiplexed pages. The other pages do have an effect however. The interaction of the complicated reference wave with all those holograms which were recorded with different, uncorrelated, reference waves produces a "haze" of random visual noise. It is this haze which determines the maximum number of holograms which may be simultaneously multiplexed and retrieved, without significant degradation, in a single piece of recording material. The rules which govern this process are the laws of information theory. A multiplexed hologram using this type of reference construction will do only as well as these ultimate laws allow.

The principal advantages of the present invention include:

All beam deflecting devices may be eliminated;

The reference beam can be prepared just as fast as the controlling signal is received. The hologram selection mechanism is therefore inherently swift.

The nature of the controlling signal may vary, according to the circumstances, from electrical signals such as binary digits carried over parallel wires to mechanical changes such as a physical distortion of the apparatus. Thus the invention lends itself to a wide variety of applications such as information processing and signal transduction;

A specific hologram may be selected at random for reconstruction. The selection of a given hologram is made by injecting the same signal into a reference selecting device as was present during the formation of the selected hologram;

The device geometry is inherently compact;

The invention lends itself to realization in the form of integrated optical circuits. This in turn leads to many additional advantages, as will be demonstrated.

There are three general groups of embodiments of this invention. The first group is similar to conventional optical holographic apparatus. This embodiment is known as the primitive one, since it was the earliest conceived and because it most resembles the existing state-of-the-art. It is not a preferred embodiment because it remains rather clumsy.

In this embodiment a coherent light source, typically a laser, illuminates a set of apparatus. This apparatus usually will include mirrors, lenses, devices for patterning part or all of the various wavefronts propagating through space, shutters and a photographic plate which records the holograms. A reference selecting device is included which modulates that portion of the light wave which serves as the phase reference. This device individually keys the formation and reconstruction of each of the holograms recorded in the photographic plate.

Several versions of the reference selector are described in individual alternatives within this embodiment. Each alternative embodiment is tailored to perform a different task or is designed to make best use of a different material.

An important new idea exhibited by the reference selector is the concept that the reference wave should be spatially modulated several times in succession before it is made to impinge on the hologram recorder. Since each of these modulations may be individually controlled and since each modulation works on the cumulative modulation of previous stages, the reference selector can be made quite flexible and sensitive.

Reference selectors are described which can be tailored for control by digital signals composed of binary digits arriving over parallel lines or by graded electrical signals such as a variable voltage or current. Mechanical strain signals which might be derived from a force, pressure or temperature change can be used to control several embodiments of the apparatus. A change in the wavelength of the coherent light can be used to select a reference pattern in still another embodiment.

A number of applications of these embodiments are also presented. These range from digital data storage, through compilation of an album of images, to electrical and environmental signal transduction.

A second group of embodiments is preferred for those applications where the hologram is to be used to store two or three dimensional images. This embodiment marries holography with the new technology of integrated optical circuity. In the field of integrated optics, light is confined to waveguides which are usually laid down on a substrate. These waveguides are similar to optical fibers. They perform a function analogous to the wiring of an electrical integrated circuit.

In this second embodiment series, the reference wave is confined to a waveguide channel and is directed into the photorecording material by a device which couples the waveguide to the photosensitive region. A variety of different reference selectors are illustrated in different embodiments within the species. Each selector is integrated as part of the reference waveguide channel.

Each selector is optimized to use a specific class of materials or is designed to respond most sensitively to a specific kind of signal. The variety of controlling signals range, as in the primitive embodiments, from digital to analog of various types.

The object wave in these embodiments is split off from the reference wave and is directed so that it may propagate through free space. This wave can fall on and illuminate any two or three dimensional object or scene. The reflected light is captured by the photoplate and is combined with the channeled reference wave to form the hologram. Upon reconstruction, the object wave will again propagate through free space and the image of the recorded object, if any, will usually be formed in free space.

These embodiments are especially valuable when applied to automatically controlled visual displays.

A third general group of embodiments is also described at length in this disclosure. This group is preferred when the invention is to be used as a digital information memory. This group fully merges holography with the elements of integrated optical circuits.

As in the previous groups, the reference wave is confined within a waveguide. It also is patterned by a reference selector so that it may uniquely reference a single one of many multiplexed holograms. The specific reference selector embodiments are the same as those of the preceeding groups since both these groups use an integrated reference circuit.

In this new species, the object wave is also confined to an integrated optical waveguide. In the usual case, both the reference and object waveguides are integrated on the same substrate. The object waveguide, like the reference waveguide, will normally be directly coupled to the region which is photosensitive.

Integrated as part of the object circuit is a page composer. This device patterns the object wave in accord with a signal. Usually the signal will be digital and will be a binary number representation of some alphanumeric character. It is this coded pattern which the hologram is designed to store.

Also included as part of the object circuit is a page reader. This device examines the reconstructed wave and recovers the signal which was originally injected into the page composer.

The specific details of the page composer and page reader are not pertinent to this invention; provided, these devices are compatible with the rest of the apparatus which forms a given embodiment.

Several advantages accrue when holography is combined with integrated optics to make an integrated holographic circuit. Among these advantages, the following are outstanding:

The holographic circuit is very compact;
Small signal levels serve to select a specific hologram;
The cycle time of a circuit is very short;
Power consumption is minimal;
The circuit is physically stable so that a special protective environment is not needed;

Holographic circuits may be stacked in such a way that images formed by each device may be physically superimposed.

These advantages are the primary reasons why embodiments which employ integrated optical circuits are to be preferred.

The emphasis in this specification is primarily an optical holography. This might be defined as holography employing electromagnetic waves ranging from the infrared through the ultraviolet regions of the spectrum. However, holography itself is a much broader discipline.

In its origin it was intended as a method for compensating the aberrations of an electron microscope. The waves that were to be recorded were not electromagnetic light waves at all, but rather, they were the quantum probability waves associated with electrons.

More recently, holograms have been successfully recorded using microwave radio waves, strain waves such as sound waves in air and water, and even with numerical arrays stored and manipulated within computers. There is even work going on now in the field of network holography. In this concept, propagating waves are replaced, in the holographic apparatus, by signal carrying, wired networks. These networks are permanently wired in some pattern which serves the function of preserving mutual coherence. The principle of superposition, required in holography, is satisfied if the network (in regions away from the recording section) is linear and the signals within it are merely added and subtracted.

It is evident that, since holography itself is broad in the forms it can take, this invention may also be broad in its embodiments. There is certainly no reason to limit its application to the optical portion of the electromagnetic spectrum. Thus, the term "wave assembly" is intended to describe the complete collection of employed signals propagating through the holographic apparatus. This assembly will most typically consist of light waves, propagating from a common source, which are split into reference and object waves and which perhaps, during reconstruction, provide light for the eye of the beholder.

In the more general case, the wave assembly may include strain waves, electromagnetic waves, quantum physical probability waves, arrays of numbers embedded in a computer and patterns of signals propagating through a hard-wired network. All of these types of "wave" must be regarded as being within the domain of the invention. For ease in explanation, however, the optical version of the invention is described, for that is the one likely to prove most useful.

It is, therefore, a primary objective of this invention to provide improved methods for the storage and retrieval of information.

Another goal of this invention is to provide improved means for forming optical holograms.

A third object of the invention is to provide new techniques for storing, in a single photosensitive storage device, many holograms such that a specific hologram, chosen at random, may be reconstructed, upon demand, without significant interference from the other stored holograms.

An important object of this invention is to provide the means whereby optical holography and integrated optical circuitry may be compatibly joined in such a way that the optical circuitry plays a critical role in the formation and reconstruction of the hologram.

Another intent of the present invention is to demonstrate methods whereby holograms, formed in conjunction with integrated optical circuits, may be multiplexed with selective reconstruction.

A further goal of the invention is to provide optical holographic data and image storage apparatus which is exceptionally compact, which is fast in operation and which consumes relatively little power.

Still another object of the invention is to show improved mechanisms whereby environmental conditions may be detected and transduced into optical or electrical signals.

It is also an objective of the present invention to provide novel means whereby environmental inputs can be used to control the selective reconstruction of one or several holograms.

Another important object of this invention is to set forth new methods for preparing the reference wave for use in holography.

A more particular object is to show how the reference wave may be properly prepared for multiplexing holograms by spatially modulating it, in a controllable way, using spatial patterns of short auto-correlation length.

It is a further object of this invention to provide methods for automatically changing the spatial pattern, used to modulate the reference wave into other patterns, uncorrelated with the first and with each other.

Still another object is to illustrate techniques for automatically selecting at random a specific spatial modulation patterns out of a sequence of patterns which are not cross correlated, by application of a signal representing a binary number.

Yet another object of this invention is to provide mechanisms for automatically selecting a specific spatial modulation pattern, having the desired cross correlation characteristics, by application of a single electrical signal of prespecified amplitude.

A yet further objective of the invention is to provide means for automatically selecting a specific spatial modulation pattern of many available, having desired correlation characteristics, by the application of a mechanical or thermal strain.

An additional object of the invention is to set forth means for automatically selecting a spatial modulation pattern, of appropriate correlation characteristics, by variation of the wavelength of the light used to form the hologram.

Another significant objective of this invention is to provide means for holographically storing a table of binary numbers, with different binary numbers as addresses, such that application of an address number signal will cause the ultimate regeneration of the stored binary number.

A still further goal of this invention is to provide apparatus which will allow multiplexed holographic systems to be stacked and yet still be independently operated without mutual interference.

The novel features which are believed to characteristic of the invention, both as to organization and method of operation, together with further objects and advantages thereof will be better understood from the following description, in connection with the accompanying drawings, in which several preferred embodiments of the invention are illustrated by way of example. It is to be expressly understood, however, the the drawings are for the purposes of illustration and description only and are not intended as a definition of the limits of the invention.

FIG. 1, includings

FIG. 4 which includes FIGS. 4A and 4B, indicates typical configurations of individual reference modulator plates.

FIG. 5 shows a perspective illustration of a second embodiment of the present invention including a partial integration of an optical system with an integrated optical waveguide structure.

FIG. 6 provides a perspective example of a third general embodiment of the invention in which the optical system is in a fully integrated, optical circuit configuration.

FIG. 9, consisting of FIGS. 9A and 9B, shows alternative embodiments of an integrated optical version of a reference wave selector.

FIG. 10, including FIGS. 10A and 10B, shows another example in two views of a finger electrode structure which may be used for the integrated optical circuit.

FIG. 11, made up of FIGS. 11A, 11B, 11C and 11D, illustrates in several views, a pebble surface type integrated reference selector which is specialized to transduce mechanical and thermal strains.

Figure 1A:
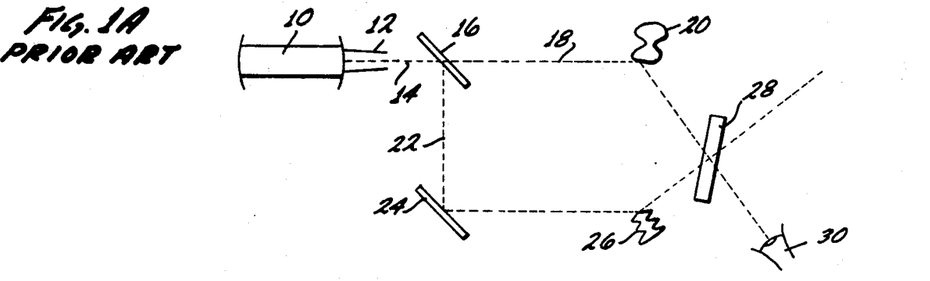
FIGS. 1A and 1B, is a schematic presentation of an optical holographic system of the prior art.

Referring to FIG. 1, we find illustrated a schematic representation of optical holographic apparatus. This apparatus is configured to form holograms in the "ghost" imaging or source compensation mode familiar from prior art. FIG. 1A shows the arrangement typically found when the hologram is being formed. A coherent light source 10, typically a laser, emits a beam or possibly a broad wavefront of light 12. This wave travels along a path 14 until it is intercepted by a beam splitter 16. The beam splitter 16, which might for example be a partially silvered mirror, directs the wave of light into two paths. A first path 18 is regarded as the signal or object beam and leads to the illumination of the object 20 whose form we wish to holographically record.

The other beam of light 22 created by the beam splitter might be reflected from a mirror 24 onto some complicated object 26 which serves as a spatial modulation or reference wave encoding device. The light scattered out of the signal and reference waves by objects 20 and 26, respectively, propagates more or less in the direction of a photo sensitive recording plate 28. This recorder might typically be a sheet of photographic film. However, other recording media such as photopolymers, dichromated gelatins or certain ferroelectric materials might serve as well. At the recording plate 29 the reference and signal wavefronts overlap and create a mutual interference pattern. This pattern of light and dark is recorded by the photoplate 28 as a hologram.

Downstream of the hologram recording plate 28, an observer 30, can be placed to view the object 20. The view of this object 20 is framed by the closer recording plate 28.

Figure 1B:
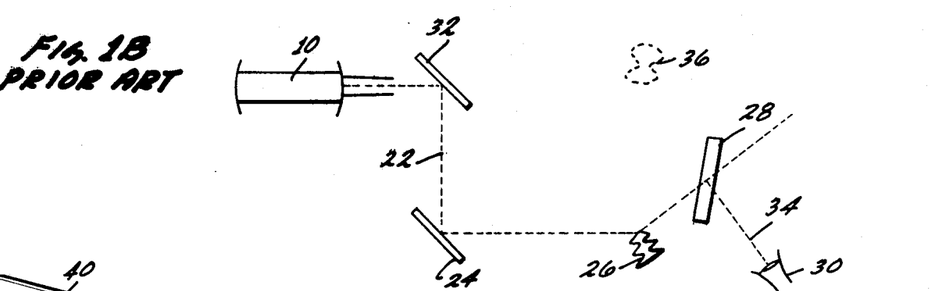

In FIG. 1b, which is the configuration used during the holographic reconstruction of the object wave, many of the same elements used to record the hologram remain present. The primary difference is that there is no illuminated object 20 which can be viewed by an observer 30. In the configuration shown here, the entire light output of the coherent light source 10 is reflected from a mirror 32 which is placed in the identical position as the original beam splitter 16. An alternative arrangement, which would work as well, would be to put up a card or shutter to block the signal beam 18. Or, perhaps the object 20 may be removed from the apparatus.

A critical requirement for reconstruction is that the reference wave encoding object 26 be in precisely the same position as it was during the formation of the hologram. Also, it is essential that it be illuminated in precisely the same way. This means that any mirrors 24, 32 in the path of the reference wave 22 must be positioned and oriented exactly as they were during the formation of the hologram.

After the reference wave has scattered from the object 26 it propagates to the hologram plate 28 and possesses, as it falls across this plate, precisely the same form it had during the formation of the hologram. It is presumed that during the reconstruction phase, illustrated by FIG. 1B, the recording made by the photosensitive plate 28 has been developed so that it is capable of spatially modulating any light which falls upon it.

The reference wave 22, spatially modulated by the hologram 28 creates a new wavefront 34 which is identical to the old wavefront emanating from the object 20. An observer 30, viewing the scene through the hologram will seen an image 36 (the ghost image) of the original object in the original position and having precisely the same visual appearance as the original object (which may not even be present). The recreation of the wavefront which originally came from this object is called the holographic reconstruction of the object wave.

So far all of this is quite standard and has been carried out many times in different laboratories. An important new concept contributed by this invention is the idea that the reference scattering object 26 may be automatically varied and controlled so that the reference wave 22 can be uniquely patterned in many different ways. Each reference wave pattern is configured so as to have a short autocorrelation length and to be uncorrelated with the other patterns available.

In this way each patterned reference wave can serve as a unique phase reference in the recording of a given hologram. Many holograms can be stored, through multiple exposures one on top of another, in the common recording plate 28. Each hologram may then be uniquely reconstructed (without significant crosstalk from the other holograms) by regeneration of the patterned reference wave used to form that specific hologram.

Figures 2, 3:
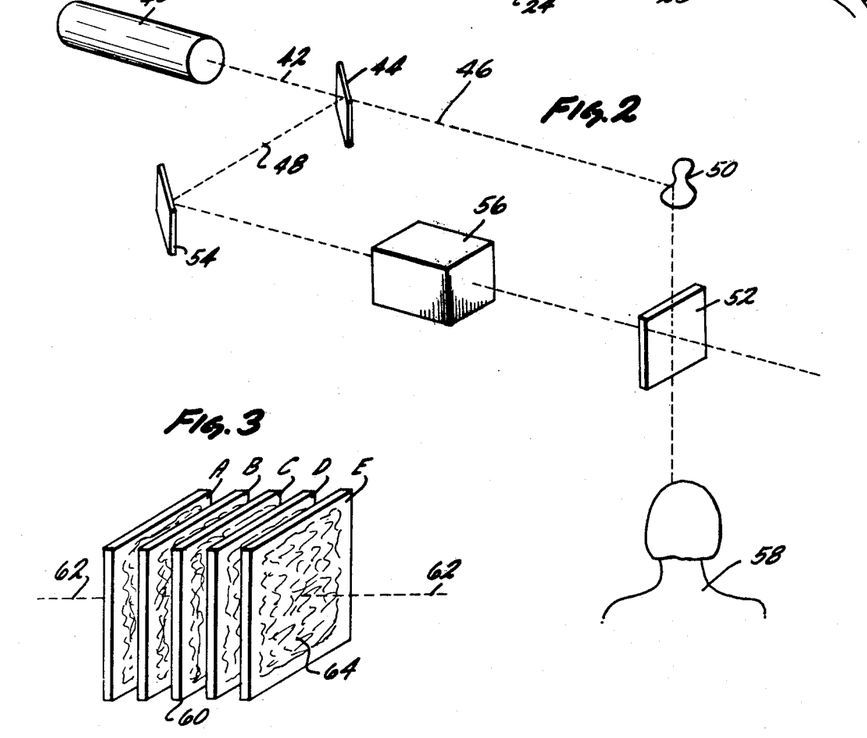
FIG. 2 is a perspective view of a primitive embodiment of the present invention.
FIG. 3 illustrates a stack of reference beam spatial modulation plates, which together make up a reference selector useful in the embodiment of FIG. 2.
Figures 4A, 4B, 5, 6:
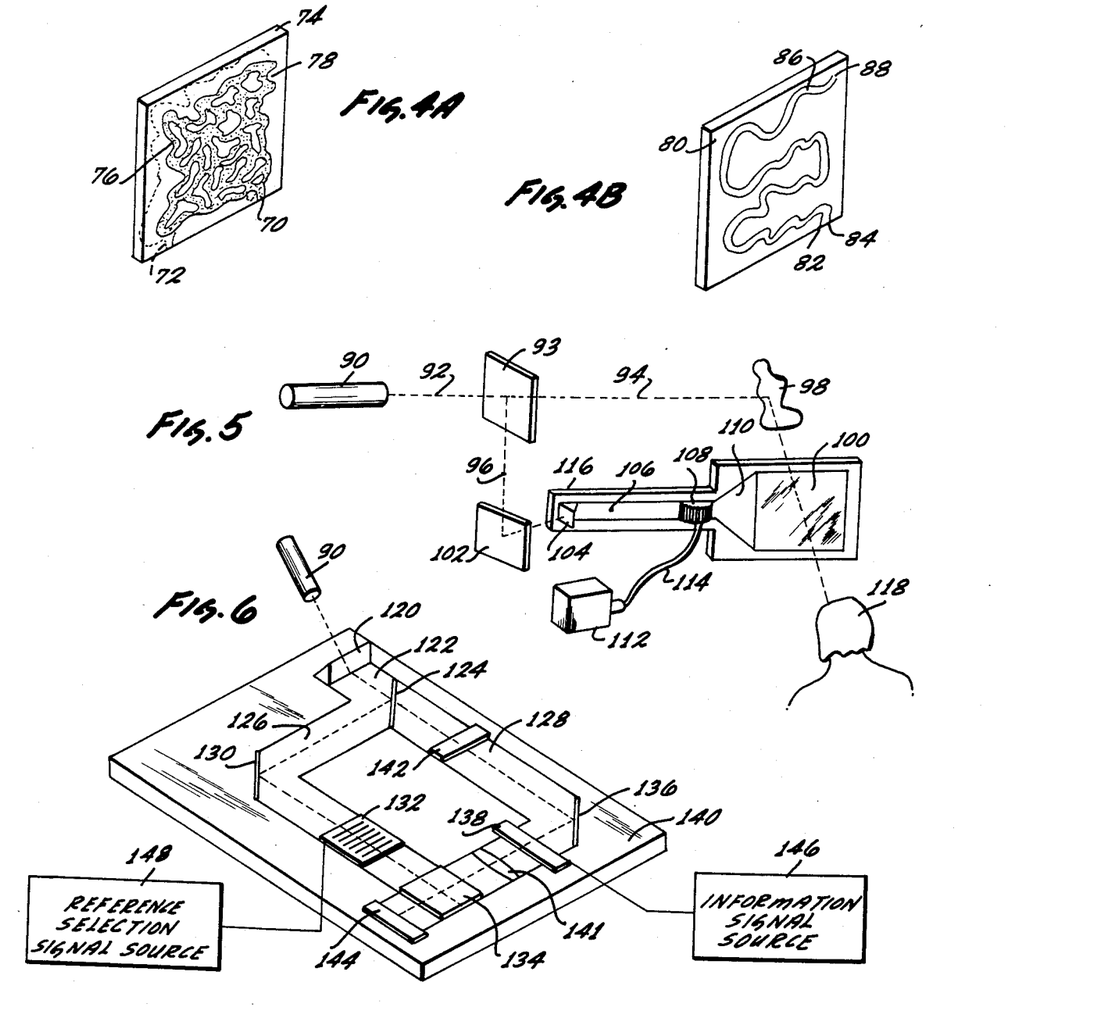

Three general configurations of apparatus are illustrated to show how this concept might be carried out. FIG. 2 provides a view of a holographic system which is similar to the common laboratory apparatus used in making holograms. The configuration presented in FIG. 5 is an example of a composite system in which the reference wave is channeled into an integrated optical circuit where it is prepared for the illumination of a holographic recording plate. In FIG. 6 a view is given of a fully integrated optical circuit which is capable to forming and reconstructing optical holograms.

The configuration presented in FIG. 2 is very similar to that of FIG. 1. It has a light source 40 which emits a beam of coherent light 42. This beam is split by a mirror device 44 into an object or signal wave 46 and a reference wave 48. The signal wave illuminates an object 50 and the scattered light is collected by a recorder plate 52 during the formation of a hologram. The reference wave 48 may reflect from one or more mirrors 54 into a reference selecting device 56. This device is shown as being transmissive but it might, in practice, be designed as a reflective mechanism. After passing through the reference selector 56 the reference wave falls on the recorder 52 where it provides a spatial phase reference.

In this general configuration the light from both the object 46 and reference 48 waves arrive at the hologram recorder 52 from out of the plane of the recorder.

The purpose of the reference selector is to modulate the reference wave with a specific spatial pattern which is automatically chosen by the application of some signal or environmental input. The modulation pattern must meet the correlation requirements previously outlined if the system is to work to form and uniquely reconstruct multiplexed holograms. Presently, some examples will be given of devices which can fill the role of the reference selector.

In FIG. 2 a single object 50 is shown as the subject which is to be holographed. In forming a multiplexed hologram this object will be different upon each exposure. Each hologram might be formed of a different physical object, of a single object repositioned or of an object whose surface pattern or shape is changed for each exposure. The particulars are not important because the apparatus will be capable of recording the light scattered by the varying objects regardless of what changes occur.

In the case where the apparatus is used to store data, particularly numerical data, the object 50 will take the form of what is known as a "Page Composer". This is a device which modulates the signal wave by impressing on it one or more stylized patterns each of which represents data to be stored. For example, if the data stored is a binary number, the page composer might take the appearance of an arrangement of light and dark spots which correspond to the ones and zeros of the number.

Typically, on reconstruction the light path 46 is blocked so that the object 50 is not illuminated. The reference selector 56 patterns the reference wave so that it can decode and reconstruct a specific one of the holograms stored in the recording plate 52. The observer 58, will see, upon this reconstruction, the image of the object which has been selected for reconstruction. When data from a page composer is being reconstructed the observer is likely to be an automatic device called a "Page Reader". The page reader might consist of photocells, circuitry, lenses and whatever else is needed to interpret the pattern formed by the page composer and translate it into a useful form.

The key component of the general configuration is the reference selector. The reference selector itself has many embodiments. For example, a sheet of opal glass will serve in certain cases. This is a piece of glass material possessing many small randomly placed defects each having an index of refraction which differs from that of the glass matrix. In order to be useful the opal glass must be fairly thick in the direction along the propagation of the reference wave. If the wavelength of the light is changed sufficiently, the modulation pattern produced by the opal glass will also change into a new pattern which is uncorrelated with the first. Moreover, opal glass as it is normally made can usually be depended upon to impress on the reference wave a spatial modulation pattern of short autocorrelation length.

A more sensitive and controllable type of reference selector is illustrated in FIG. 3. This figure shows a stack of slightly separated spatial modulation plates 60, intersecting the path of the reference wave 62. The spatial modulation imposed by a given plate is represented by the random texture 64.

Suppose, for example, that each plate in the stack was a sheet of opal glass, or perhaps ground glass. Stacking the plates with some separation very much enhances the sensitivity of the reference selector to any physical changes which the selector may undergo. The reason for this is that each plate spatially modulates the wave that it receives from all the preceding plates. This is a nonlinear process. Moreover, all that is needed to produce a new pattern, uncorrelated with previous pattern is to shift one of the plates sideways through a distance equal to its autocorrelation length. If the plate is opal glass or very finely ground glass this will be a very short distance-typically, a few microns.

Also, movement of one or several of the plates along the optical axis 62 will also produce a decorrelation if the distance traveled is sufficiently great. The reason the latter example works is because the light wave, in propagating between the plates, undergoes a linear transformation called a Fresnel transformation. By changing the spacing, the parameters of this transform are also changed, resulting in a nonlinear modification or modulation of the wavefront. When combined with the spatial modulations produced by the plates, a change in spacing generates a new reference wave pattern which may be uncorrelated with the others.

We see, therefore, that the reference selector can be made very sensitive to those changes in the environment which shift the relative positions of the plates. Thus, by appropriately coupling the plates to mechanical strain apparatus and by controlling the strain through environmental signals, such as pressure or temperature values, a multiplate stack can act as a sensitive transducer, spatially modulating the reference wave with patterns which change as a function of the environmental inputs. A preferred embodiment for a mechanical transducer couples the plates alternately so that every other plate shifts laterally in opposite directions.

Since a change in the index of refraction of the medium between the plates will optically change the effective spacing between the plates, anything which controls the index of refraction of the intervening medium will also control the reference pattern selection. This provides still another embodiment.

Another form of the reference selector which is of very considerable interest preserves the modulation plates in a rigid stack assembly. Control of the reference wave spatial modulation pattern is achieved by applying electrical or magnetic fields to the individual plates. This is illustrated in FIG. 4.

In FIG. 4A a typical plate is shown. Transparent electrodes 70 and 72 are located on either side of the transparent plate 74. The electrodes form a spatial structure 76 which appears random in this drawing. The pattern of this structure must have a short autocorrelation length. Clear areas 78 appear as part of the overall electrode pattern. In a typical case the electrode patterns 70 and 72 are essentially identical.

The plate material should be electro-optically active. If it is not a good electrical insulator, an insulating layer should be provided under each electrode. When a voltage is applied between electrodes 70 and 72 an electric field induces a change in the plate material according to the pattern of the electrode. The preferred change will be a shift in the index of refraction of the plate as a function of the local electric field. If this occurs the phase pattern of the wave surface will be distorted resulting in a spatial modulation. A much less satisfactory type of modulation would be one in which light is locally absorbed in the plate when an electric field is applied. This kind of spatial modulation reduces the intensity of the reference wave and consequently the brightness of the holographically reconstructed image.

FIG. 4B shows an alternate electrode structure. In this case the electrodes are both deposited on the same side of the plate material 80. The two electrodes 82 and 84 snake in parallel along a random-like maze path 86. When a voltage is applied between the electrodes an electric field is set up between them which varies from place to place along the surface of the plate. If the plate is electro-optically active perpendicular to the electrical field axis, a spatial modulation of the passing light wave will be produced. Alternatively, the two electrodes may be joined at their far end 88 to form a closed loop. An electric current passed through this loop will set up a complicated magnetic field which will induce a magneto-optically active plate material, or substrate, to spatially modulate the reference wave. Again, the preferred embodiment provides that the spatial modulation be a pattern of optical phase modulation only.

When modulation plates, which can be electrically activated, are stacked up in an arrangement such as is shown in FIG. 3, an important result is obtained.

With no signal applied to a plate in the stack the waveform passes through with only the intrinsic modulation of the dead plate. This may be defined as the "zero" state. When an electrical signal is applied to the plate at a sufficient level of strength the plate will spatially modulate the passing wave with a new pattern which is uncorrelated with the zero state modulation pattern. This may be regarded as a unit, or "one" state.

In a stacked plate assembly, change of any plate signal state from zero to one or vice versa will produce a change in the overall modulation pattern of the assembly to a new pattern which is uncorrelated with the previous one. This is true, under the conditions assumed, regardless of the number of plates which are activated or whichever plates they may be.

We can, therefore, associate the pattern of activated plates with a specific binary number. For example, in FIG. 3 the reference selector stack consists of five plates: A, B, C, D and E. Activation of just plate A can be represented by the binary number 10000, plate B by the number 01000, and so on. Activation of more than one plate can also be represented by a binary number. For example, activation of plates B, D and E corresponds to the number 01011. Each of the activation states, corresponding to a different binary number, produces a new spatial modulation pattern, uncorrelated with that of any other activation state.

We see, therefore, that a five plate assembly, as illustrated, will produce $2^5$ unique spatial modulation patterns. The choice of which pattern is selected will depend on which combination of the plates is activated. That is to say, it will depend on which binary number signal is inserted, in parallel, into the reference selector.

The principle of stacking separately activated spatial modulators along the optical axis of the reference beam is exceptionally important and constitues one of the key ideas contributed by this invention. It will soon be shown how other general species of embodiment make use of this same principle.

Another embodiment of the invention makes use of the electrically activated plate stacks, arranged as in FIGS. 3 and 4. In this embodiment, however, all of the plates are wired together in parallel and are activated simultaneously. The effect of this arrangement is to greatly increase the sensitivity of the reference selector to the applied electrical signal. For example, with a five plate assembly, as the signal applied simultaneously to all five plates rises from zero value to unit value, the modulation pattern produced by the full assembly goes through $2^5$ intermediate patterns, each of which does not cross correlate with its fellows.

A typical application of this device would be an analog to digital converter. Suppose there is stored in the multiplexed hologram a series of images, each of which corresponds to a binary number of 5 bits length. Suppose further that each image is referenced by one of the $2^5$ available reference patterns. Then, application of the electrical signal level which causes the creation of one of the $2^5$ reference patterns will also cause the reconstruction of the corresponding binary number image. The image may in turn be converted to a digital electrical signal by appropriate means, thus completing the analog to digital conversion.

For example, with a five plate assembly, as the signal applied simultaneously to all five plates rises from zero value to unit value, the modulation pattern produced by the full assembly goes through $2^5$ intermediate patterns, each of which does not cross correlate with its fellows.

A typical application of this device would be in an analog to digital converter. Suppose there is stored in the multiplexed hologram a series of images, each of which corresponds to a binary number of 5 bits length. Suppose further that each image is referenced by one of the $2^5$ available reference patterns. Then, application of the electrical signal level which causes the creation of one of the $2^5$ reference patterns will also cause the reconstruction of the corresponding binary number image. The image may in turn be converted to a digital electrical signal by appropriate means, thus completing the analog to digital conversion.

Turning now to FIG. 5, a source of coherent light 90, emitting a light beam 92 impinges upon a beam splitter 93 and is directed into first and second path 94 and 96.

The object wave 94 is scattered from an object 98 and propagates through space so as to fall on a photosensitive material or photoplate 100. The object wave 94 impinges on the photoplate 100 from out of its plane, generally orthogonal thereto. However, any path that is nonparallel to the surface of the photoplate 100 may be employed.

The reference wave 96 has a somewhat different treatment. This wave 96 is directed by appropriate optics 102 into a coupling device 104 of the type utilized in integrated optics circuits. The coupling device 104 channels the reference wave 96 into an optical waveguide 106. The reference wave 96 travels down the waveguide 106 until it is inserted into the photoplate 100.

Typically, photoplate 100 will be in the form of a flat sheet of limited thickness. In such a case, the reference wave 96 can be said to have been inserted into the photoplate 100 through its "edge". This may sometimes be literally true, although it is not the only possiblity.

As the reference wave 96 propagates along from the coupling device 104 to the hologram recorder, which is the photoplate 100, it passes through intermediate devices typically a reference selector 108 and a beam expanding section 110. The reference selector 108, which may be controlled by electrical signals is connected to control circuitry 112 by appropriate electrical wiring 114.

It may be of substantial importance in many applications, that the reference selector 108, the beam expanding section 110 and the photoplate 100 be rigidly tied together. The preferred method mounts them all on a common rigid substrate 116. The waveguide section 106 leading from the input coupling device 104, in most cases, should not be flexible. The reference selector 108 however, does not have to be rigid. However, for the purpose of illustration, all of these components are shown mounted on the single rigid substrate 116.

Ultimately, the reconstructed wavefront is viewed by an observer 118.

When the optical waveguide is mounted on a substrate, which is usually rigid, but may not always be, it is known as an integrated optical circuit. Such circuits have been extensively described in publications such as, for example, the book "integrated Optics" edited by Dietrich Marcuse and published in 1973 by the IEEE Press of the Institute of Radio, Electrical and Electronic Engineers, Lib. of Congress Cat. No. 72-92691, Int'l. Std. Catalog 0-87942-022-7.

A hologram is created, in the apparatus of FIG. 5, by provideding an object 98 and illuminating it by the object beam 94. At the same time, a predetermined signal combination is applied to the reference selector 108 which spatially modulates the applied reference wave 96 propagating down the waveguide 106. The modulated reference beam is applied to the photo plate 100 and provides an illuminating beam parallel to the surface. In the photo plate 100, the modulated reference beam interferes with the impinging object wave to produce an interference pattern which is recorded as the hologram.

After the photoplate 100 has been developed, the object can be reconstructed by beaming a reconstructing wave through the reference wave 96 path. The predetermined signal combination is again applied to the reference selector 108. To an observer 118 a reconstructed image of the object 98 will appear at the location where object 98 was at the time the hologram was made. During reconstruction, however, there is no need for an object beam 94 and that path is blocked.

The geometry of the apparatus of FIG. 5 suggests that it provides an important advance over conventional holographic systems. It is, for example, much more stable because the critical parts of the optical system are tied together with inherently stable waveguide structures on a common substrate. Furthermore, this part of the system can be made very compact.

This latter aspect has importance if the hologram is to be used primarily as a readout device or display. Indeed it is as a display of prerecorded images and information that this embodiment is likely to have its greatest application. Once a set of holograms have been recorded it is only necessary to direct coherent light of the correct wavelength properly into the waveguide 106 and apply an appropriate signal or stimulus to the reference selector 108 in order for a selected image to be reconstructed. There is no need for an elaborate external arrangement of mirrors and objects and other items of a typical laboratory.

Normally, when this apparatus is used as a display the substrate under the photoplate 100 will be transparent. The reconstructed image will appear in the place of the original object 98, long since removed. The viewer 118 will look "through" the hologram at a reconstructed image much as if the hologram were a window. In other configurations it is possible for the image to form between the hologram and the observer. The hologram thus forms a background, and it would not always be essential in this case to have a transparent substrate.

An alternative embodiment of the present invention is the fully integrated optical holographic system, illustrated in FIG. 6. Light from the coherent source 90 is directed into a coupler 120 and passes completely into a short waveguide segment 122. The wave propagates until it impinges on a beam splitting device 124. Here it is directed along two separate waveguides 126, 128. One waveguide 126, acts as the reference channel. The reference wave is directed around corners in the waveguide 126 by reflecting device 130. It eventually passes through a reference selector 132 and into a photo recording region 134.

The object wave proceeds through the beam splitter 124 in the waveguide 128, turns a corner 140, using appropriate reflectors 136 and passes through a "page composer" 138, and optionally a lens 141, into the photo recording region 134. Along the way it can be intercepted by a shutter element 142 which is open when a hologram is being formed but which is closed when a hologram is being reconstructed.

The page composer 138 displays a variety of information in the form of stylized images. These pictures may be imaged, by one or more lenses 141, onto a page reader device 144. This device "interprets" the image, possibly through a bank of photocells (not shown) and delivers the information recorded inside the system to the outside world.

This embodiment is "programmed" by feeding information into the page composer 138 from an information signal source 146. Concurrently, a signal is delivered to the reference selector 132, from a reference selector signal source 148. Light is furnished by the source 90. The resulting interference pattern between the reference and object waves is recorded in the photo recording region 134.

Next, a different set of information signals is fed into the page composer 138 and a different signal is injected into the reference selector 132. A new hologram is then recorded in a second "exposure" of the photo recording material 134. The series of exposures continues until all desired information is stored.

At this point the photo recording region 134 is developed and fixed. In some future photo materials, it may be possible to develop the hologram after each exposure and then resensitize the recording material before the next exposure. However, such material is not presently available.

After the set of holograms is formed, the information contained in a particular member of the set may be retrieved in the following series of steps. The light source 90 is turned on and the shutter 142 is closed, blocking the path of the "object" wave and causing its complete absorption. The address signal for the hologram of interest is fed into the reference selector 132 by the reference selection signal source 148. The newly patterned reference wave interacts with the set of holograms recorded in 134 and reconstructs only the desired wavefront. This wavefront forms an image on the page reader 144, which corresponds to that appearance of the page composer 138 at the time the reconstructed hologram was first formed.

An alternative embodiment of the fully integrated circuit shown in FIG. 6 requires the object path only during the formation or programming of the hologram set. Once the holograms are formed and developed the object waveguide and all its substrates such as the beam splitter 124 and page composer 138 may be "broken" off. This would leave on the substrate, as part of the circuit, just the reference waveguide and its component parts, such as the reference selector 132, together with the hologram recording material 134 itself. The primary advantage of such an arrangement would be to reduce the size of the finished, preprogrammed circuit.

When a waveguide structure is integrated with a hologram it should, for most applications, be subject to some constraints. The thickness of the waveguide should be on the order of, at most, a few wavelengths. The best condition occurs when the wave is in the lowest transverse mode across the direction of thickness. This condition ensures that warping of the waveguide will not introduce phase variations across the wavefront which will destroy the quality of the holographic reconstruction.

A second requirement is that the transverse dimension in the plane of the waveguide should be very many wavelengths wide. This is to ensure the existence of an adequate number of mode patterns of the wavefront in this direction so that each of a number of multiplexed holograms may have a unique reference. In short, a wide waveguide is necessary to propagate a great many complicated patterns, none of which are cross correlated.

The third constraint is that the wavefront must not be able to escape through the walls of the waveguide. This translates primarily into the requirement that the edges of the waveguide not be ragged and that the core and cladding material and surfaces be free from defects.

The integrated optical structures of the prior art, have not, to date, provided a sufficient repertory to allow the merging of holography and integrated optical circuitry. Additional important components are needed and some versions of which are described herein. A crucial requirement which must be met is the existence of some mechanism for joining an integrated waveguide to the photosensitive material used to form the hologram.

Figure 7:
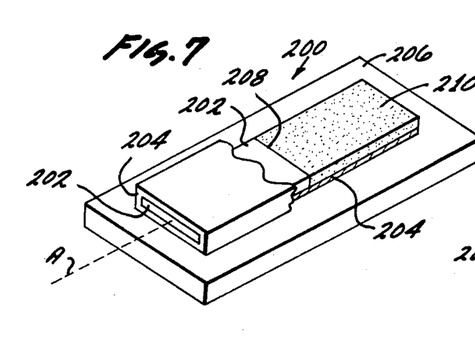
FIG. 7 is a perspective view, partly broken away of integrated optical circuitry joined to photosensitive material for making holograms.

In FIG. 7 is illustrated an example of a typical waveguide device 200 consisting of a core 202 and cladding 204, in deposited on a substrate 206. In this embodiment the core 202 material makes a butt joint 208 with the recording material 210. The light is confined to the photosensitive recording material 210 by total internal reflection, just as it is in the core of the integrated waveguide. Indeed, the recording material 210 may be regarded as just a photosensitive section of the waveguide 200 itself. If the substrate 206 under the recording material 210 is not a low index of refraction, transparent material, or if it is an absorbing material, it will likely be important to keep a layer of cladding material 204 beneath the recording material 210 and in some cases, low index cladding may completely surround the recording material 210. In FIG. 7, the top cladding is shown as stripped away to better show the internal structure.

During the reconstruction process, the reference wave will scatter from microscopic variations in the recording material, after development. The pattern of these variations is the recorded hologram. If the hologram records a wavefront which impinged on the recording material 210 from free space, the scattered wave which makes up the reconstruction will be decoupled from the recording material 210, and will thenceforth propagate through free space. However, if the object wave was originally introduced into the recording material 210 through the waveguide 200 and remains confined to the interior of the recording material, the reconstruction of the object wave will likewise be confined within the recording material 210.

Figure 8:
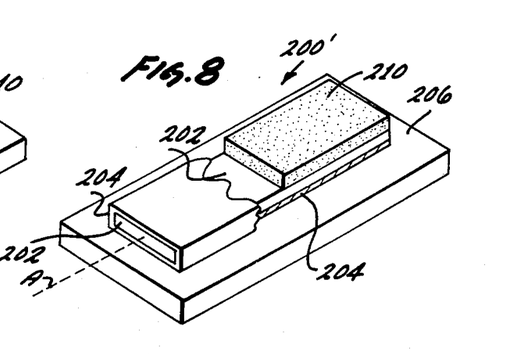
FIG. 8 is a perspective view, partly broken away of an alternative integrated optical structure combined with photosensitive material.

FIG. 8 shows another way of accomplishing the photo sensitive, recording material waveguide interface. As before, a waveguide 200', consisting of a core 202 and cladding 204 is laid on a substrate 206. Light propagates down the waveguide along a general axis A. Between the waveguide core 202 and the substrate 206 there is always a cladding layer 204 (unless the substrate itself has the properties needed to serve as cladding.

The photosensitive recording material 210, in this embodiment, is mated to the waveguide by laying it immediately on top of a (partially stripped) section of the core 202. If the index of refraction of the recording material 210 is sufficiently similar to that of the core 202 beneath it, the light propagating along the core 202 will penetrate into the recording material 210. This is because there will be relatively little or no total internal reflection at the core recording material interface.

As in FIG. 7, the top cladding is shown partially stripped away. If the top of the recording material 210 is surrounded by air, there will be no problem reflecting light at the interface since gas (or a vacuum) has a low refractive index. However, if the assembly is immersed in some other medium, the photo sensitive recording material/core combination will have to be jacketed in low index cladding.

It is possible to record a hologram in apparatus of the type configured in FIG. 5 but lacking a reference selector. Such holograms would be of limited use when there is no reference selector. When a reference selector is inserted in the reference waveguide section, the multiplexing of holograms becomes practical. Although many types of reference selectors can be envisioned the following embodiments are particularly interesting because of their simplicity, flexibility and sensitivity.

Figures 9A, 9B:
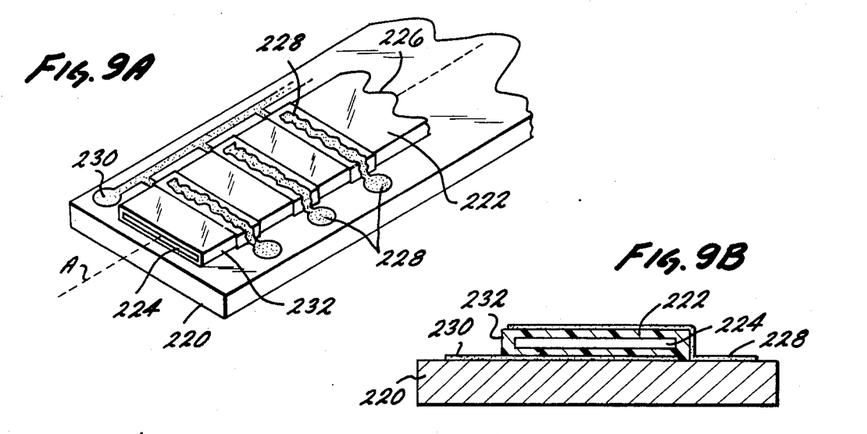

In FIG. 9, including FIGS. 9A-9B, an electrically controlled type of selector is illustrated. Upon a substrate 220, a clad waveguide 222 is integrated. Light propagates down the waveguide 222 roughly along the principal axis A. Along the way it passes through one or more clad sections of electro-optically active material 224. This material has a sufficiently high index of refraction so that light is confined within it just as it is within the inactive core 226. Indeed, the active material 224 should be regarded as intermediate sections of the waveguide core 226. Above and below the active sections 224 of the waveguide 222 are placed electrodes 228 and 230. As shown in FIG. 9B, the active core material 224 is surrounded by a passive electrically insulating, cladding 232. The top electrode 228 and the bottom electrode 230 complete the structure.

Returning to FIG. 9A, bottom electrode 230 is shown to be a common electrode, shared by all of the active sections (three of which are shown). When a voltage is applied between a top electrode 228 and the bottom electrode 230 an electric field is set up between them, which influences the intervening active material 224. In a typical and preferred embodiment, the electro-optically active material 224 will undergo a slight change in its index of refraction as a result. This, in turn, will produce a phase shift in the passing light.

The amount of phase shift undergone by the passing light is proportional to the electrical field strength and the distance which the light travels while under the fields's influence. By increasing the electric field strength or by widening the electrodes, the phase shift can be increased. If one of these two parameters is varied, in some pattern, across the width of the waveguide, the pattern will be "impressed" on the passing confined wave as a spatial phase modulation. It is easiest to vary the width of the electrode as it stretches across the waveguide. This configuration is illustrated in FIG. 9A. Light, passing an electrode structure at different lateral positions, will traverse electric field influence through sections of different lengths and will, therefore, be phase shifted (modulated) by different amounts.

For an ideal reference selector, the modulation pattern, which is determined by the electrode shape, will have a short autocorrelation length. Generally speaking it will happen if the electrode pattern is sufficiently complicated, that there will be at least two voltage levels which produce modulation patterns which are not cross correlated. There may be many more such voltage levels, as well, depending on the design.

The integrated optical circuit electrode structure pictured in FIG. 9 takes the place, in integrated holographic optics of the free standing plate shown in FIGS. 5 and 6. As in the earlier versions of the reference selector, great advantages are gained by stacking the individual spatial modulators along the path of propagation of the reference wave. In FIG. 9 this "stacking" appears as a series of electrode structures overlying optically active regions, laid successively, with some spacing, across the waveguide. The impression is one of a set of "fingers".

As in the earlier embodiments of the reference selector, this version is capable of selecting reference wave modulation patterns on the basis of either binary number input signals or, if the top electrodes are tied together, graded analog signals.

Figures 10A, 10B, 11A, 11B, 11C, 11D:
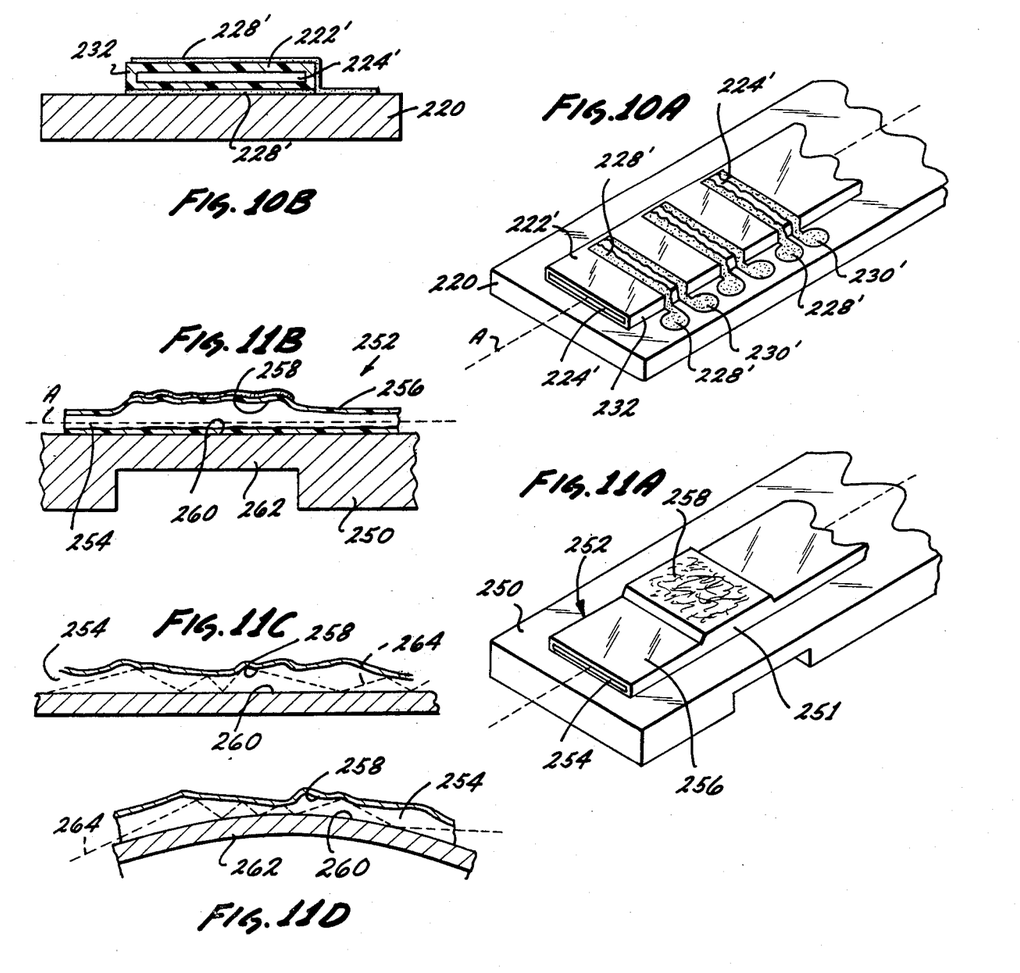

A somewhat different embodiment is illustrated in FIG. 10, which include FIGS. 10A and 10B. This embodiment is preferred when, for maximum sensitivity, the electric field in the active core region should be oriented along the path of light propagation. As in the structure of FIG. 9, the reference selector in this version consists of a series of electrodes stretching across the axis of light propagation A. The light is confined to a waveguide 222', deposited on a substrate 220, and passes through electro-optically active regions 224'.

An electrical signal causes a change in an active region 224' when it is applied as a voltage across a pair of electrodes 228' and 230'. This sets up a field between the two electrodes which passes through the intervening active material 224'. The electric field strength is patterned by the varying separation between the edges of the two electrodes. This field pattern induces a spatial variation in transmissive properties of the active material. When a wavefront passes through this activated region, it is spatially modulated.

FIG. 10B, which is a cross section through part of this structure illustrates additional structure. The waveguide core of active material 224' is surrounded by a passive electrically insulating cladding 232. The finger electrode 228' should lie both above and below the waveguide. This is to ensure that the electric field penetrates fully through the waveguide and has, therefore, a maximum modulating effect.

Aside from the differences just described, the structure of FIG. 10 has the same uses and behaviors as that of FIG. 9. An important aspect of both these configurations is that their electrode structures possess very little electrical capacity. This means they may be operated at very high speeds with relatively little power consumption.

FIG. 11, including FIGS. 11A, 11B, 11C and 11D illustrate a substantially different type of reference selector. As shown in FIGS. 11A and 11B, a substrate 250 carries a waveguide structure 252 consisting of a core 254 and cladding 256. Waves are directed to pass down the optical path A. In the reference modulation region of the selector, the core material 254 is thickened until it is many wavelengths thick. Thus, in this region the wavefront may bounce back and forth between the upper and lower cladding layers. In FIGS. 11C and 11D, this effect is shown by a zig-zag of the path of propagation A.

In the thickened core region of the selector, the upper surface 258, and possibly the lower surface 260 of the waveguide are roughened. The pattern of roughness should be similar to a random one both in transverse and longitudinal dimensions. The effect is much like that of a pebbled (or shower) glass, although on a much smaller scale. The undulations laid into the surface of the core should be sufficiently shallow that the critical reflection angle is not exceeded and the wave front remains trapped by total internal reflection.

A usual requirement is that the autocorrelation length of the surface pattern be short, on the order of a few wavelengths, for greatest sensitivity.

The thickened waveguide structure is, in this embodiment, laid over a thinned section 262 of the substrate 250. The substrate in this region is thin enough that it will readily flex in response to mechanical forces. The waveguide 252, being bound to the substrate 250 will of course flex along with the substrate. FIG. 11 is illustrative only, in that the scale of the waveguide 252 and that of the substrate 250 are not even remotely similar. This is because it is not at all feasible to illustrate this structure to scale. Actually, the substrate will generally be, even in its thinnest section, many times thicker than the thickest part of the wave guide 252.

In FIGS. 11C and 11D an example is given of what happens when the substrate flexes. In FIG. 11C the substrate 250 is unflexed. A wave, indicated by a dashed line 264 bounces irregularly down the thick, pebbled waveguide section. When the substrate 250 is flexed, as demonstrated in FIG. 11D, the wave-guide conforms to the new shape of the substrate 250. The path taken by a ray 264 bounces along a new path. Thus, upon flexing, a different spatial modulation pattern will be impressed on the passing wave.

This device can be constructed to act as the key element of a very sensitive transducer. The flexing of the substrate in response to an environmental signal, such as pressure or temperature change, induces a changed spatial modulation pattern on the passing wave. This modulated wave is, in turn, interpreted by using it to reconstruct a prerecorded hologram which contains data about the conditions which caused the flex. For example, the device might be used as an altimeter gauge wherein atmospheric pressure of some value causes a certain amount of flexing. At this value of flex the reference wave propagating from the device might reconstruct an image of numbers which correspond to the altitude at which this pressure normally occurs. The specific relationship between the atmospheric pressure and the altitude reading may be highly nonlinear since the holographic device is arbitrarily programmable.

Figure 12:
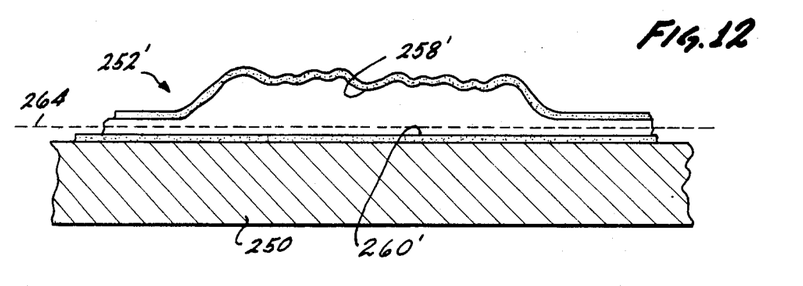
FIG. 12 shows an alternative embodiment of an integrated optical, pebble surface type, reference selector for selecting the reference wave configuration on the basis of wavelength.

A slightly different embodiment is provided in FIG. 12, wherein like parts in FIG. 12 have reference characters similar to those of FIG. 11. The primary way this device differs from the embodiment of FIG. 11 is in having a relatively thick substrate 250 underlying the entire reference selector. Indeed, it is important that the structure of the device be mechanically very stable.

The random undulations 258' in the surface of the thickened waveguide section 252' must be at most a few wavelengths in length and relative height. With this condition, the wavefront will be highly diffracted when it scatters from the core's surface. In being diffracted, the wavefront's phase pattern will become quite sensitive to the wavelength of the wave. Hence, a change in the wavelength of the wave injected into the reference selector will produce a differently modulated wave propagating out of the selector. Information is therefore stored and retrieved based on the frequency or wave length of the laser used to create the record.

Figure 13:
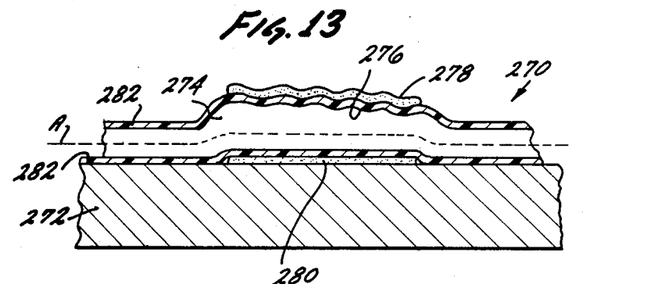
FIG. 13 provides still another alternative pebble-type, reference selector activated by application of an electrical signal.

FIG. 13 provides still another variation of the "pebbled surface" reference selector. In this embodiment, the waveguide 270 is laid on a substrate 272 which is relatively thick and mechanically stable. A wave, propagating along a general axis A enters a thickened region of the waveguide 270. The core in the thickened section 274 is electro-optically active. At least one surface 276 in this section is pebbled with a shallow pattern of random undulations of dimensions on the order of the wavelength of the passing wave. Above and below the thick section 274 of waveguide 270 are placed electrodes 278, 280. These electrodes are separated from the core 274 by electrically insulating cladding layers 282.

Upon application of a voltage between the electrodes 278 and 280, the electro-optically active core 274, which lies between, changes its optical characteristics. A preferred change is in the index of refraction of the medium. Whatever the change, the wave propagating down the waveguide will scatter differently from the pebbled surface and so will be subject to a different spatial modulation.

Prerecorded integrated holograms mounted on transparent substrates can be "stacked" up. An example of this arrangement is provided in FIG. 14. Here, a coherent light source 300 emits a beam 302 which is directed into a distribution device 304. This device 304 couples some light into each of a stack of integrated holographic plates 306. Each plate 306 has a region of photosensitive material 308 which contains many prerecorded (and developed) holograms, multiplexed together. The selection of a specific hologram for reconstruction is controlled by a reference selector 310 which spatially modulates the reference wave passing through a waveguide 312, from the distribution device 304, to the hologram 308. The reference selector 310 is driven from a reference selection source 314.

Figures 14, 15:
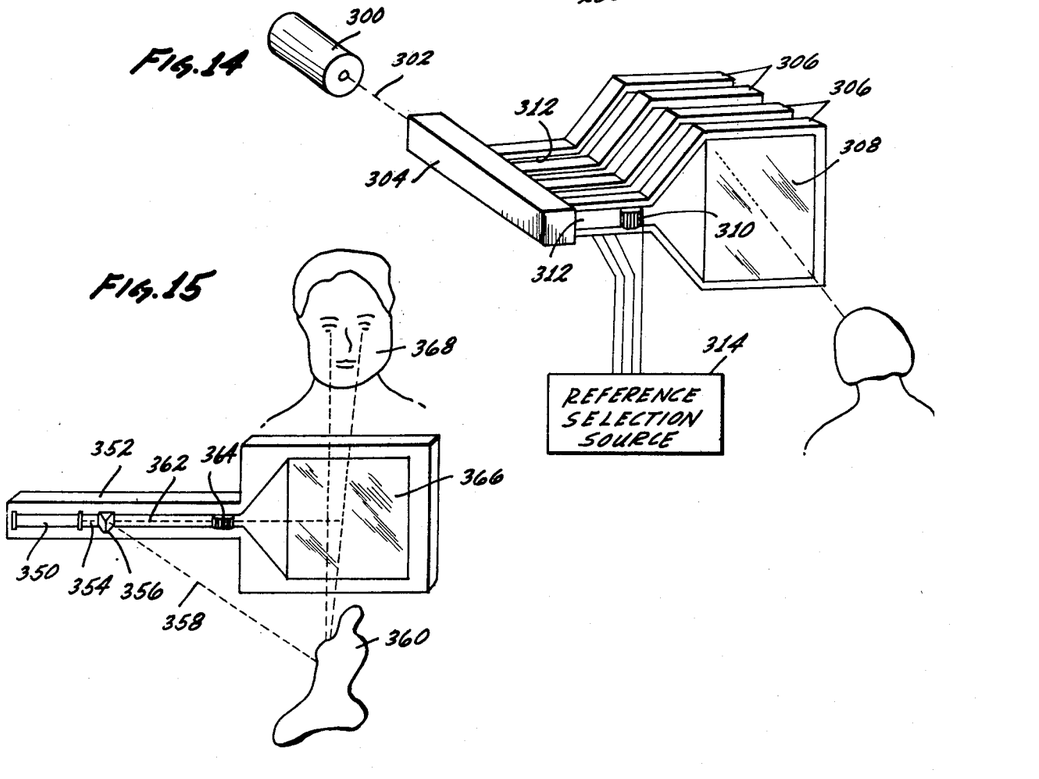
FIG. 14 illustrates a typical stacked hologram configuration.
FIG. 15 shows another embodiment in which a reference wave is channeled within a waveguide and the object wave propagates freely through space with the wave source integrated on the common substrate.

A typical application of such a stack might be in information display. For example, one plate might record many separate images of a small dot which is variously positioned throughout a volume of space. These dot images could be rapidly switched in some sequence so as to provide a visual trace of a three dimensional path or surface. Another plate might store the images of various three-dimensional, coordinate systems. A third plate could contain holograms of a variety of alphanumeric messages. A fourth might have maps, schematics or charts, and so on. The stack as a whole could therefore be used as a complex graphical display system, having the capability of performing three-dimensional waveform scans within a concurrent three-dimensional coordinate system.

The embodiments described so far have for the most part relied upon light sources which are external to the integrated reference wave structure. This will probably be the most important arrangement for the next several years since light sources which can be directly integrated with waveguides, as yet are relatively incoherent. Work is progressing on integrated lasers and other coherent light emitting devices and at some time in the not too distant future such devices will be practical and available. Another embodiment illustrated in FIG. 15, takes advantage of such a light source.

In this configuration a light source 350 is integrated on the same substrate 352 as the rest of the holographic circuitry. A section of waveguide 354 connects the light source 350 with a coupler 356. The purpose of the coupler 356 is to divert a fraction of the light out of the waveguide 354 along a path 358. This wave is used to illuminate an object 360 which is exterior to the integrated optical circuit. The light which remains in the waveguide 354 propagates along a path 362, through a reference selector 364 into the photomaterial 366. There it combines with the light scattered by the external object 360 to form a hologram.

As in the earlier embodiments, a plurality of objects can be recorded, each with a particular spatial modulation of the reference wave by the reference selector 364. After recording and development, each object can be reconstructed for a viewer 368 by applying a reference beam with the appropriate spatial modulation by the reference selector 364.

Obviously, the human viewer 368 could be replaced by any other receiver of optical information within the scope of the present invention.

The practical applications of the invention are numerous. For example, a page composer as shown in FIG. 4, forms binary number patterns, or possibly binary coded decimal or grey code patterns. If the reference selector of FIG. 13 is employed, a very fast, analog-to-digital converter can be constructed. The hologram is set up to store a series of images, each of which feeds a different number to the page reader. Each image is keyed by a different electrical signal voltage level fed to the reference selector. After the recording is completed and developed placement of a specific voltage on the selector will cause the page reader to "see" the image of the number which corresponds to that level. Notice that there does not have to be a linear relationship between the "level" of the reference signal and the numerical value read out at the page reader.

If a reference selector, such as that depicted in FIG. 11 is used, the integrated optical circuit will produce a series of numerical readings which are a function of the mechanical strain of the selector. Thus, the circuit can be applied, for example, to strain gage measurements, acoustical signal pickup, thermal measurement, pressure sensing and force determination. The specific advantages of the circuit, when used for this application are speed of response, sensitivity, accuracy of measurement and compactness.

Application of the reference selectors of FIGS. 9 and 10 to the integrated holographic system results in a device capable of translating one binary number into another. The translation is arbitrary so that any type of truth table may be constructed. Thus, the device, when configured in this way, can act, for example, as a logic circuit of vast capabilities or perhaps a "lookup" adder or multiplier. Because the embodiment can be made very small, has an immense storage capacity, is very fast and requires little power, it is ideal for application to computers. It seems likely that the majority of circuitry of a computer might be replaced by a few devices of this sort.

The several embodiments shown might be used in somewhat different fashion of the photo recording material were "erasable". With such material the device can serve as a random access, read-write memory for active data storage.

Yet other embodiments may also prove to be valuable. In one, the light source is integrated onto the substrate of FIG. 4, in much the same fashion as it is in FIG. 15. In such an embodiment there would be no need to couple light out of the waveguide, so the coupling device 356 of FIG. 15 can be eliminated.

Thus, there has been shown a novel concept for the storage and retrieval of vast quantities of information in a compact volume utilizing simple elements. A reference beam is spatially modulated prior to interacting with an object beam to create a hologram in a photosensitive material. A plurality of holograms can be superimposed on each other in the photosensitive material, each corresponding to a different object and each having a particular spatial modulation corresponding thereto. After development of the hologram, any desired object can be reconstructed by spatially modulating the reference wave with the corresponding modulation signal.

In different embodiments, the spatial modulation is accomplished through sets of electrodes driven by binary signal generators, physically non-uniform light conductor surfaces combined with other selection criteria such as different wavelengths of radiation. Yet other embodiments employ a variable physical deformation of the structure to generate a peculiar spatial modulation pattern which is repeatable when the physical deformation is repeated. Still other embodiments employ a combination of spatial modulation techniques.

Also, according to the present invention, holograms are created using relatively thin photosensitive films by applying either the object beam or reference beam on both to the emulsion in the plane of the emulsion. Alternatively, one of the beams is in the plane and the other impinges upon the plane at some angle which may be varied. Obviously if different objects were recorded at different angles, "playback" would depend upon the angle of viewing the reconstructed image. Yet other embodiments will be readily evident to those appropriately skilled in the art. Because of the variety of embodiments, no attempt is made here to summarize all the possibilities. For this reason, the invention should be considered as limited only by the scope of the appended claims.

What is claimed as new is:

1. Apparatus for creating in a storage medium a plurality of individually accessible holograms comprising in combination:
   (1) storage medium;
   (2) a source of substantially coherent illumination;
   (3) a first path between said source and said medium, adapted to include an object whose image is to be recorded as a holographically stored wave front;
   (4) a second path between said source and said medium adapted to exclude the object whose image is to be recorded said first and second paths intersecting in said medium; and
   (5) spatial modulator means, interposed in said second path, for selectively modifying the illumination in a predetermined fashion including a set of submodulators each of which can controllably affect the correlation state of the passing wave, for inducing a plurality of controlling spatial modulations on the passing wave generating mutually uncorrelated, spatially modulated sets; the members of the set of modulations produced by said modulator means being sharply autocorrelated, said submodulators being arranged along the path so as to successively affect the propagating wave; whereby a plurality of wave fronts each corresponding to a different image may be stored in said medium, each having associated therewith a particular modification of the illumination in said second path at the time the wave front is stored.

2. The apparatus of claim 1 wherein said storage medium is a relatively thick, photosensitive emulsion.

3. The apparatus of claim 1, wherein said second path is within a waveguide.

4. The apparatus of claim 3, wherein said first path is within a waveguide.

5. The apparatus of claim 1, wherein said spatial modulator means include a waveguide section having at least a first and second interior surface, at least one of said surfaces having deformations extending out of the nominal plane of said surface and arranged along the path of wave propagation for successively affecting the propagating wave.

6. The apparatus of claim 1 wherein said spatial modulator means include a plurality of electrode members, each member influencing substantially the entire wavefront propagating in said path, each member being selectively energizable in response to an applied electrical signal to successively modulate the propagating wave as it travels along the optical path.

7. The apparatus of claim 6, wherein said spatial modulator means further include a common electrode member positioned to cooperate with said plurality of electrode members.

8. The apparatus of claim 6, wherein said electrode members are elongated, said plurality of elongated electrode members are arranged in cooperating pairs, each pair being selectively energizable.

9. The apparatus of claim 1 wherein said spatial modulator means include mechanical deforming means coupled to said second path for selectively introducing non-linearities into said second path whereby a propagating wavefront is successively affected by each non-linearity introduced.

10. The apparatus of claim 1 wherein said spatial modulator means include transducer means coupled to said second path for selectively introducing non-linearities into said second path in response to applied stimuli.

11. Apparatus selectively reconstrucing a wavefront corresponding to an image from a plurality of holographically stored wavefronts in a medium, each wavefront being created with a corresponding, particular spatial modulation of the illumination utilized in storing the wavefront, comprising in combination:
   (1) source of substantially coherent illumination;
   (2) a path between said source and the medium; and
   (3) spatial modulation means interposed in said path for selectively modifying the illumination in said path in a predetermined fashion with a different controlling spatial modulation pattern, said modulation means including a set of submodulators each of which can controllably affect the correlation state of the passing wave; said submodulators being arranged along the path so as to successively affect the propagating illumination, said modulation means inducing a plurality of spatial modulations on the passing wave such that the members of the set of spatial modulations produced by said modulation means are mutually uncorrelated and sharply autocorrelated, whereby a plurality of wavefronts are stored in the medium, each having associated therewith a particular modification of the illumination at the time the wavefront was stored, and each capable of being selectively retrieved by appropriate modulation of the reconstructing illumination.

12. The apparatus of claim 11 wherein said storage medium is a relatively thick, photosensitive emulsion.

13. The apparatus of claim 11 wherein said path is within a waveguide.

14. The apparatus of claim 11, wherein said spatial modulator means include a waveguide section having at least a first and second interior surface, at least one of said surfaces having deformations extending out of the nominal plane of said surface and arranged along the path of wave propagation for successively affecting the propagating wave.

15. The apparatus of claim 11 wherein said spatial modulator means include a plurality of electrode members, each member influencing substantially the entire wavefront propagating in said path, each member being selectively energizable in response to an applied electrical signal to successively modulate the propagating wave as it travels along the optical path.

16. The apparatus of claim 15 wherein said spatial modulator means further include a common electrode member positioned to cooperate with said plurality of electrode members.

17. The apparatus of claim 15 wherein said electrode members are elongated said plurality of elongated electrode members are arranged in cooperating pairs, each pair being selectively energizable.

18. The apparatus of claim 11 wherein said spatial modulator means include mechanical deforming means coupled to said path for selectively introducing non linearities into said path, whereby a propagating wavefront is successively affected by each non-linearity introduced.

19. The apparatus of claim 11 wherein said spatial modulator means include transducer means coupled to said path for selectively introducing non linearities into said path in response to applied stimuli.

20. A process for creating in a storage medium a plurality of individually accessible holograms comprising the steps of:
(1) applying to an object whose image is to be recorded as a holographically stored wave front substantially coherent illumination in a first path between a source and a storage medium;
(2) applying to the medium substantially coherent illumination in a second path adapted to exclude the object whose image is to be recorded, said first and second paths intersecting in the medium; and
(3) selectively modifying the illumination in said second path in a predetermined fashion with an ensemble of individual controlling spatial modulation patterns, each member of which is sharply autocorrelated and is uncorrelated with the other members of said ensemble, each such member modulation pattern being derived from the successive imposition on the illumination of controllable spatial modulation, whereby a plurality of wave fronts corresponding to images may be stored in said medium, each having associated therewith a particular modification of the illumination in said second path at the time the wave front is stored.

21. A process for selectively reconstructing a wave front corresponding to an image from a plurality of holographically stored wave fronts, each wave front being created with a corresponding, particular spatial modulation of the illumination utilized in storing the wave front, comprising the steps of:
(1) applying to the stored wave fronts substantially coherent illumination along a path; and
(2) selectively modifying the illumination in said path in a predetermined fashion with an ensemble of individual controlling spatial modulation patterns each member of which is sharply autocorrelated and is uncorrelated with the other members of the ensemble; each member modulation pattern being derived from the successive imposition on the illumination of controllable spatial modulations, whereby a plurality of wave fronts stored in the medium, each having associated therewith a particular modification of the illumination at the time the wavefront was stored, can be selectively retrieved by appropriate modulation of the reconstructing illumination.

22. The apparatus of claim 1 wherein said spatial modulator means includes a plurality of individual modulating plates interposed in said path each of said plates having a modulating effect upon the illumination, each of said plates being individually translatable to change the modulating effect upon a wave front propagating down said second path.

23. The apparatus of claim 22 wherein each of said plates is translatable in a direction orthogonal to said second path.

24. The apparatus of claim 22 wherein each of said plates is translatable in the direction of said second path.

25. Apparatus for creating in a storage medium a plurality of individually accessible holograms comprising in combination:
(a) a source of substantially coherent illumination;
(b) a substrate;
(c) storage medium mounted on said substrate;
(d) a first light confining path of said substrate between said source and said medium, adapted to include an image creating device for providing images to be recorded as holographically stored wave fronts;
(e) a second light confining path on said substrate between said source and said medium adapted to exclude the image creating device, said first and second paths intersecting in said medium; and
(f) spatial modulator means on said substrate interposed in said second light confining path for selectively modifying the illumination in said second path in a predetermined fashion with a different controlling spatial modulation pattern, and said modulator means being composed of a set of submodulators each of which can controllably affect the correlation state of the passing wave, said submodulators being arranged along the path of propagation so as to successively affect the propagating illumination, for inducing a plurality of spatial modulations on the passing light to produce a set of spatial modulations, the modulation patterns of the ensemble members of said set being sharply autocorrelated and mutually uncorrelated, whereby a plurality of wave fronts corresponding to images may be stored in said medium, each having associated therewith a particular modification of the illumination in said second path at the time the wave front is stored.

26. The apparatus of claim 25 further including shutter means in said first light confining path for blocking illumination to the image creating device.

27. Apparatus selectively reconstructing a wave front corresponding to an image from a plurality of holographically stored wave fronts stored in a medium, each wave front being created with a corresponding, particular spatial modulation of the illumination utilized in storing the wave front, comprising in combination:
(a) source of substantially coherent illumination;
(b) a substrate;
(c) a light confining path on said substrate between said source and the medium; and
(d) spatial modulation means on said substrate interposed in said light confining path for selectively modifying the illumination in said path in a predetermined fashion with a different controlling spatial modulation pattern, said modulation means including a set of submodulators each of which can controllably affect the correlation state of the passing wave, said set of submodulators being arranged along the path so as to successively affect the propagating illumination, to induce a plurality of spatial modulations on the passing light in an ensemble, the members of said ensemble being mutually uncorrelated and sharply autocorrelated; whereby a plurality of wave fronts stored in the medium, each having associated therewith a particular modification of the illumination at the time the wave front was stored, can be selectively retrieved by appropriate modulation of the reconstructing illumination.

28. For use in apparatus for creating in a storage medium a plurality of individually accessible holograms, a spatial modulator for creating and retrieving the plurality of holograms comprising in combination:

a plurality of individually modifiable spatial modulating elements each adapted to be interposed in the optical path to act in concert with the others for selectively modifying the illumination in the path in a predetermined fashion said individual spatial modulation elements being arranged so that the illumination in the path passes through each element in succession, said elements, acting in combination, producing a set of spatial modulations which act on the wave front in the path, each member of said set of spatial modulations being sharply autocorrelated in the spatial domain and substantially uncorrelated with all the other members of the set, the wave front produced by said modulator occupying substantially the same region of space regardless of the details of the particular spatial modulation pattern which has been imposed, whereby a plurality of wave fronts each corresponding to a different image may be stored, each having associated therewith a particular modification of the illumination.

29. The apparatus of claim 28 wherein each of said spatial modulator elements is a modulating plate, each of said plates being individually translatable to change the modulating effect upon a wave front propagating down the optical path.

30. The apparatus of claim 29 wherein each of said plates is translatable in a direction orthogonal to the optical path.

31. The apparatus of claim 29 wherein each of said plates is translatable in the direction of the optical path.

32. The apparatus of claim 29 wherein each of said plates is a ground glass plate.

33. The apparatus of claim 29 wherein each of said plates is a pebbled-glass plate.

34. The apparatus of claim 29 wherein each of said plates is an opal glass plate.

35. The apparatus of claim 28, wherein said spatial modulator includes a waveguide section having at least a first and second interior surface, and said spatial modulating elements include deformations extending out of the nominal plane of at least one of said surfaces and arranged along the path of wave propagation for successively affecting the propagating wave.

36. The apparatus of claim 28 wherein said spatial modulating elements comprise a plurality of electrode members, each member influencing substantially the entire wavefront propagating in said path and each member being selectively energizable in response to an applied electrical signal to successively modulate the propagating wave as it travels along the optical path.

37. The apparatus of claim 28 wherein said spatial modulator includes mechanical deforming means coupled to the optical path for selectively introducing non-linearities into the optical path whereby a propagating wavefront is successively affected by each non-linearity introduced.

38. The apparatus of claim 1 wherein substantial diffraction of the propagating illumination in the second path takes place between the submodulator sections.

39. The apparatus of claim 11 wherein substantial diffraction of the propagating wave front takes place between submodulator sections.

40. The apparatus of claim 28 wherein substantial diffraction of the passing wave takes place between said individually modifiable spatial modulating elements.

* * * * *